United States Patent
Chiu et al.

(10) Patent No.: US 9,775,264 B1
(45) Date of Patent: Sep. 26, 2017

(54) DISPLAY DEVICE AND WALL MOUNT MODULE THEREOF

(71) Applicant: Wistron Corporation, New Taipei (TW)

(72) Inventors: Yu-Wei Chiu, New Taipei (TW); Yu-Hua Chang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/216,687

(22) Filed: Jul. 21, 2016

(30) Foreign Application Priority Data

May 17, 2016 (TW) .............................. 105115224 A

(51) Int. Cl.
| H05K 7/18 | (2006.01) |
| F16M 11/20 | (2006.01) |
| F21V 21/14 | (2006.01) |
| A47G 1/16 | (2006.01) |

(52) U.S. Cl.
CPC ............... *H05K 7/183* (2013.01); *A47G 1/16* (2013.01); *F16M 11/2014* (2013.01); *F21V 21/14* (2013.01); *Y10S 248/924* (2013.01)

(58) Field of Classification Search
CPC ...... F16M 13/02; F16M 13/022; F16M 11/10; F16M 11/2014; A47B 97/00; F21V 21/14; B60R 2011/0084; A47G 1/16; Y10S 248/924; B25J 9/1623
USPC ................... 248/274.1, 279.1, 495, 917, 924
See application file for complete search history.

(56) References Cited

U.S. PATENT DOCUMENTS

| 7,823,308 | B1* | 11/2010 | Munson | H05K 5/04 345/1.1 |
| 8,724,037 | B1* | 5/2014 | Massey | H04N 5/655 348/836 |
| 9,625,091 | B1* | 4/2017 | Massey | F16M 13/022 |
| 2005/0127260 | A1* | 6/2005 | Dittmer | F16M 11/041 248/221.11 |
| 2005/0237732 | A1* | 10/2005 | Lagman | A47B 57/40 362/132 |

(Continued)

FOREIGN PATENT DOCUMENTS

TW  201236292 A1  9/2012

OTHER PUBLICATIONS

Office action dated Jun. 15, 2017 for Taiwan application No. 105115224, dated May 17, 2016, p. 1 line 12-14, p. 2 and p. 3 line 1-3.

*Primary Examiner* — Zachary M Pape
*Assistant Examiner* — Douglas Burtner
(74) *Attorney, Agent, or Firm* — Winston Hsu

(57) ABSTRACT

A wall mount module includes a first bracket, a second bracket, a first cover, a second cover, a first conducting member, a second conducting member and a power cable. The first bracket has a first hole formed thereon and the second bracket has a second hole formed thereon. The first cover is disposed on the first bracket and the second cover is disposed on the second bracket. The first conducting member is disposed between the first cover and the first bracket and exposed through the first hole. The second conducting member is disposed between the second cover and the second bracket and exposed through the second hole. The power cable is connected to the first conducting member and the second conducting member.

12 Claims, 11 Drawing Sheets

(56) References Cited

U.S. PATENT DOCUMENTS

| | | | |
|---|---|---|---|
| 2008/0043456 A1* | 2/2008 | Bernardini | A47B 57/42 362/94 |
| 2008/0067298 A1* | 3/2008 | Mossman | F16M 11/10 248/125.9 |
| 2008/0156949 A1* | 7/2008 | Sculler | F16M 13/02 248/220.21 |
| 2008/0185487 A1* | 8/2008 | Beger | F16M 11/10 248/220.21 |
| 2009/0021127 A1* | 1/2009 | Miller | H05K 7/183 312/223.5 |
| 2009/0057515 A1* | 3/2009 | Chuang | F16M 13/02 248/305 |
| 2009/0073692 A1* | 3/2009 | Berger | A47B 97/00 362/249.02 |
| 2009/0179128 A1* | 7/2009 | Boberg | F16M 11/10 248/278.1 |
| 2009/0184221 A1* | 7/2009 | Sculler | F16M 13/02 248/221.11 |
| 2009/0251880 A1* | 10/2009 | Anderson | F16M 13/02 361/825 |
| 2009/0289160 A1* | 11/2009 | Kludt | F16B 2/12 248/226.11 |
| 2010/0008072 A1* | 1/2010 | Meier-Graichen | A47B 97/00 362/127 |
| 2010/0033943 A1* | 2/2010 | Tsai | F16M 13/02 361/829 |
| 2010/0044536 A1* | 2/2010 | Huang | F16M 11/041 248/201 |
| 2011/0141671 A1* | 6/2011 | Ishizu | F16M 11/10 361/679.01 |
| 2011/0164394 A1* | 7/2011 | Hwang | H05K 5/02 361/818 |
| 2011/0174944 A1* | 7/2011 | Fredette | F16M 13/02 248/220.22 |
| 2011/0198460 A1* | 8/2011 | Stifal | F16M 11/10 248/201 |
| 2011/0211301 A1* | 9/2011 | Take | F16M 13/02 361/679.01 |
| 2012/0104205 A1* | 5/2012 | Sculler | H05K 5/0017 248/291.1 |
| 2012/0206894 A1 | 8/2012 | Huang | |
| 2012/0255919 A1* | 10/2012 | Jones | F16M 11/10 211/26 |
| 2013/0048811 A1* | 2/2013 | Tseng | F16M 11/10 248/220.21 |
| 2013/0176667 A1* | 7/2013 | Kulkarni | F16M 11/10 361/679.01 |
| 2013/0188338 A1* | 7/2013 | Melhaff | A47B 57/485 362/127 |
| 2013/0194728 A1* | 8/2013 | Manno | F16M 11/10 361/679.01 |
| 2013/0258235 A1* | 10/2013 | Li | G02F 1/133308 349/58 |
| 2013/0321715 A1* | 12/2013 | Millson | F16M 11/048 348/739 |
| 2014/0021312 A1* | 1/2014 | Nguyen | F16M 11/10 248/205.1 |
| 2014/0233205 A1* | 8/2014 | Gardes | G06F 1/1607 361/825 |
| 2014/0235093 A1* | 8/2014 | Harlan | A47F 11/10 439/370 |
| 2014/0263890 A1* | 9/2014 | McCarthy | F16M 11/10 248/205.1 |
| 2014/0267557 A1* | 9/2014 | McArdle | G06F 1/1601 348/14.08 |
| 2014/0268786 A1* | 9/2014 | Quaal | F21V 21/088 362/249.08 |
| 2015/0060615 A1* | 3/2015 | Liu | F16M 11/10 248/125.7 |
| 2015/0060616 A1* | 3/2015 | Jaramillo | A47B 81/061 248/200.1 |
| 2015/0305502 A1* | 10/2015 | Wengreen | A47B 97/00 248/205.3 |
| 2016/0189578 A1* | 6/2016 | Wicken | G09F 7/18 248/306 |
| 2016/0281915 A1* | 9/2016 | Bowman | F16M 11/045 |
| 2017/0127536 A1* | 5/2017 | Oh | G02F 1/1333 |
| 2017/0164506 A1* | 6/2017 | Anderson | H05K 7/1498 |

\* cited by examiner

DISPLAY DEVICE AND WALL MOUNT MODULE THEREOF

BACKGROUND OF THE INVENTION

1. Field of the Invention

The invention relates to a display device and a wall mount module and, more particularly, to a display device and a wall mount module capable of being thinned and being assembled conveniently.

2. Description of the Prior Art

As display technology advances, it is reasonably expected that a TV wall consisting of a plurality of display devices will be developed in the future for satisfying visual requirements. In general, the display device is usually designed as a stand-alone device, i.e. each display device is equipped with individual power supply unit (PSU) and power cable. When a plurality of display devices are used to form a TV wall, the construction may be inconvenient due to the power cable. Furthermore, the display device is mostly hanged on the wall by a wall mount module. The conventional wall mount module has a specific thickness, such that the display device cannot be attached to the wall as close as possible. Accordingly, the visual effect of the display device will be influenced.

SUMMARY OF THE INVENTION

The invention provides a display device and a wall mount module capable of being thinned and being assembled conveniently, so as to solve the aforesaid problems.

According to an embodiment of the invention, a display device comprises a device body and a wall mount module. A back of the device body has a first conducting pillar and a second conducting pillar. The wall mount module comprises a first bracket, a second bracket, a first cover, a second cover, a first conducting member, a second conducting member and a power cable. The first cover is disposed on the first bracket and the second cover is disposed on the second bracket. The first conducting member is disposed between the first cover and the first bracket and the second conducting member is disposed between the second cover and the second bracket. The power cable is connected to the first conducting member and the second conducting member. The first bracket has a first hole formed thereon and the first conducting member is exposed through the first hole. The second bracket has a second hole formed thereon and the second conducting member is exposed through the second hole. The first conducting pillar passes through the first hole and the second conducting pillar passes through the second hole, such that the device body is fixed on the first bracket and the second bracket, the first conducting pillar abuts against the first conducting member, and the second conducting pillar abuts against the second conducting member.

In this embodiment, the back of the device body may further have a recess, and the first bracket and the second bracket are accommodated in the recess.

According to another embodiment of the invention, a wall mount module comprises a first bracket, a second bracket, a first cover, a second cover, a first conducting member, a second conducting member and a power cable. The first bracket has a first hole formed thereon and the second bracket has a second hole formed thereon. The first cover is disposed on the first bracket and the second cover is disposed on the second bracket. The first conducting member is disposed between the first cover and the first bracket and exposed through the first hole. The second conducting member is disposed between the second cover and the second bracket and exposed through the second hole. The power cable is connected to the first conducting member and the second conducting member.

As mentioned in the above, the power cable of the invention is connected to the conducting member on the bracket of the wall mount module. Therefore, when the conducting pillar passes through the hole on the bracket correspondingly and then abuts against the conducting member, the power cable may supply power to the device body through an electrical contact formed between the conducting member and the conducting pillar. The user may fix the bracket of the wall mount module on a wall first and then insert the conducting pillar of the back of the device body into the hole on the bracket correspondingly, such that the display device is hanged on the wall. Accordingly, the power cable will not interfere with the assembly of the device body and the wall mount module. Furthermore, since the invention hides the conducting member in the cover, the total thickness of the wall mount module will not increase, such that the invention is capable of being thinned favorably. Moreover, when the display device is hanged on the wall, the invention may dispose the bracket of the wall mount module in the recess of the back of the device body, so as to attach the display device to the wall as close as possible. Accordingly, the invention may enhance the visual effect of the display device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
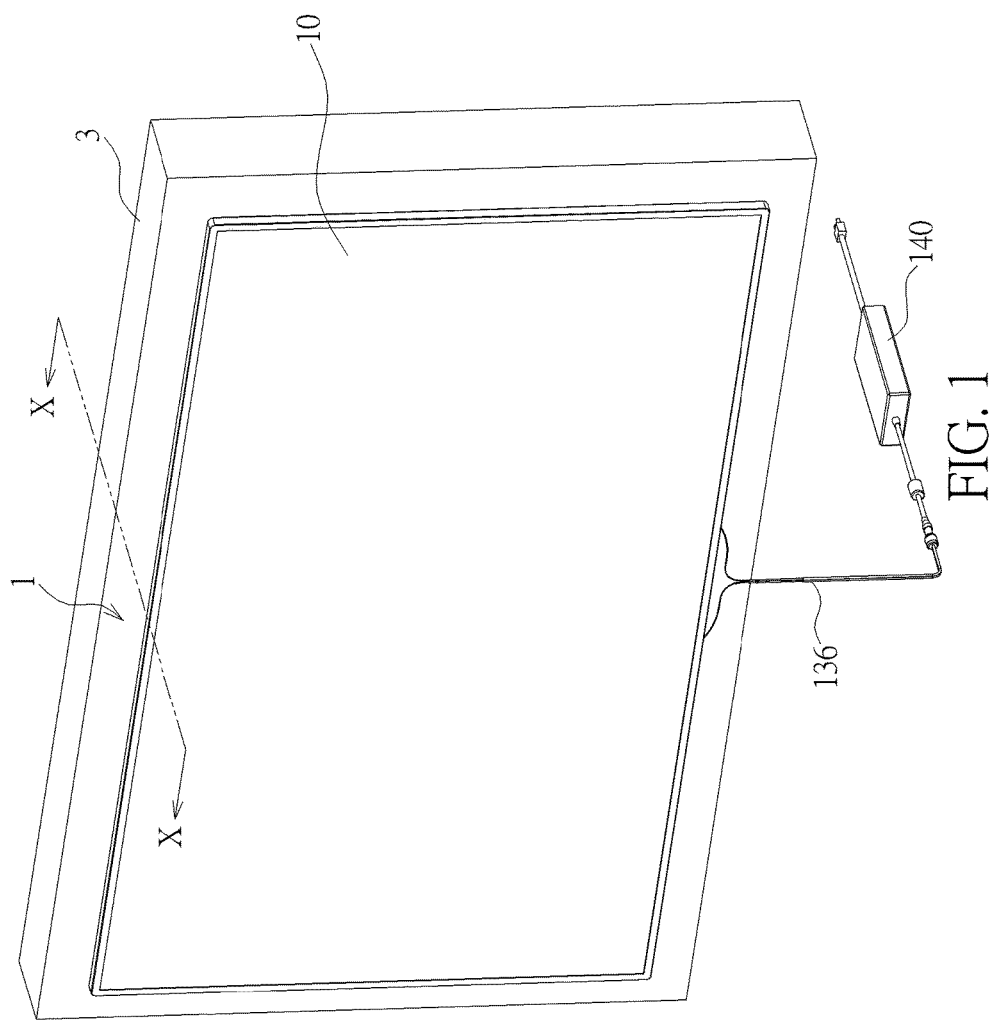
FIG. 1 is a perspective front view illustrating a display device hanged on a wall according to an embodiment of the invention.
Figure 2:
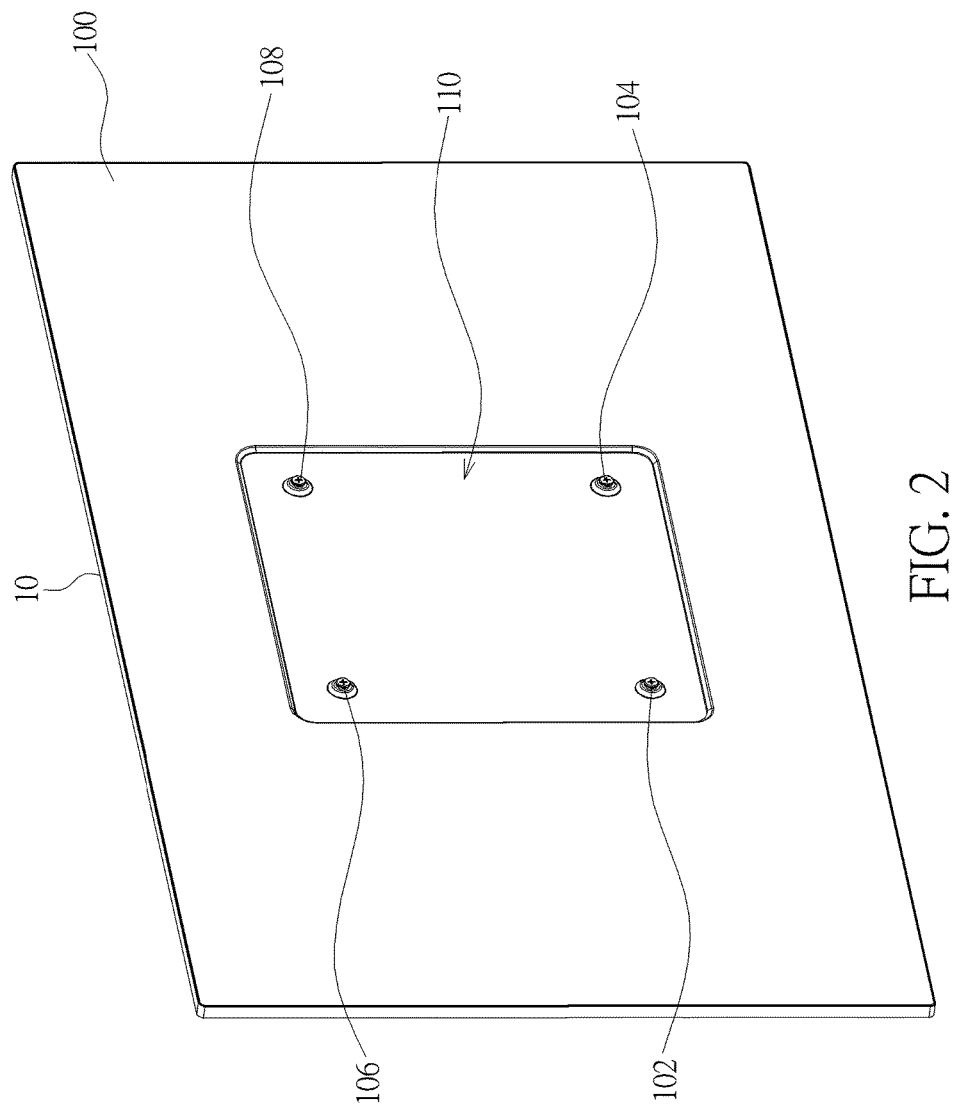
FIG. 2 is a perspective rear view illustrating the device body shown in FIG. 1.
Figure 3:
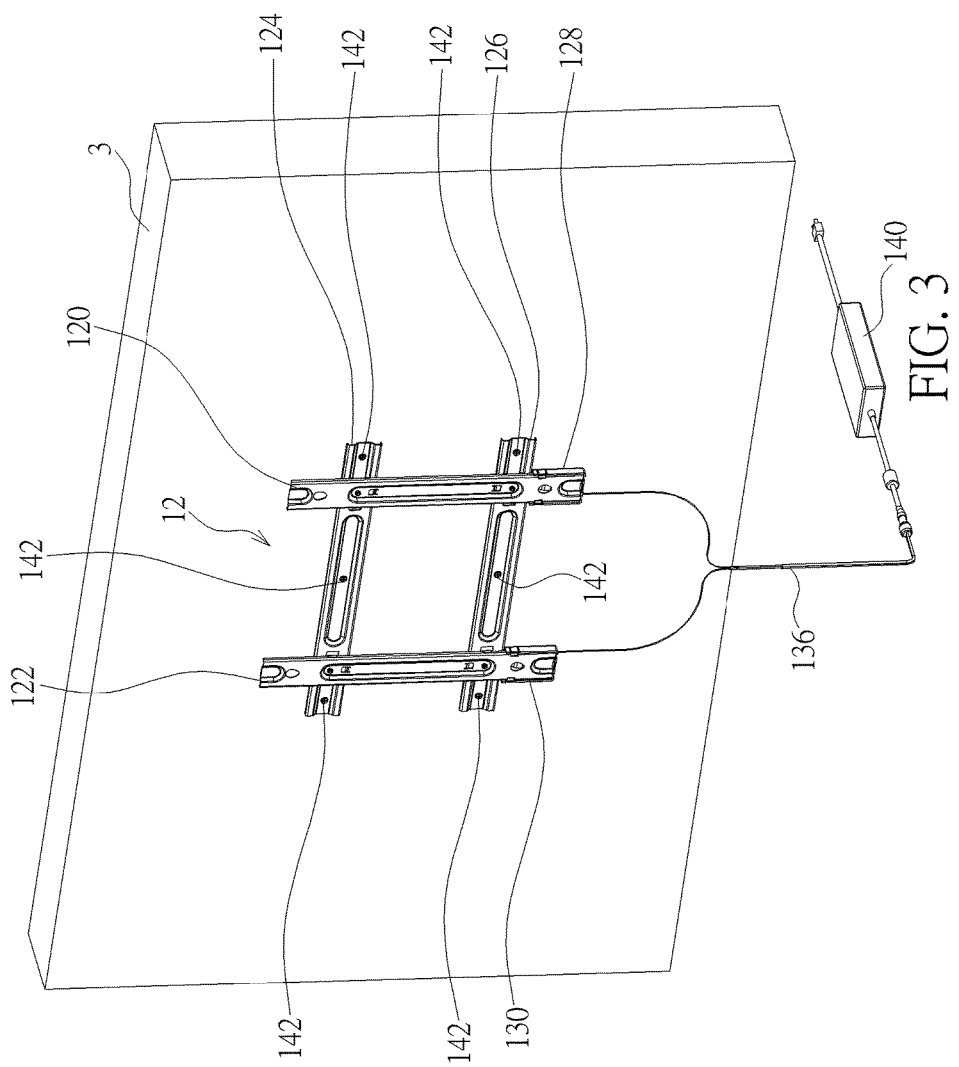
FIG. 3 is a perspective view illustrating the device body removed from FIG. 1.
Figure 4:
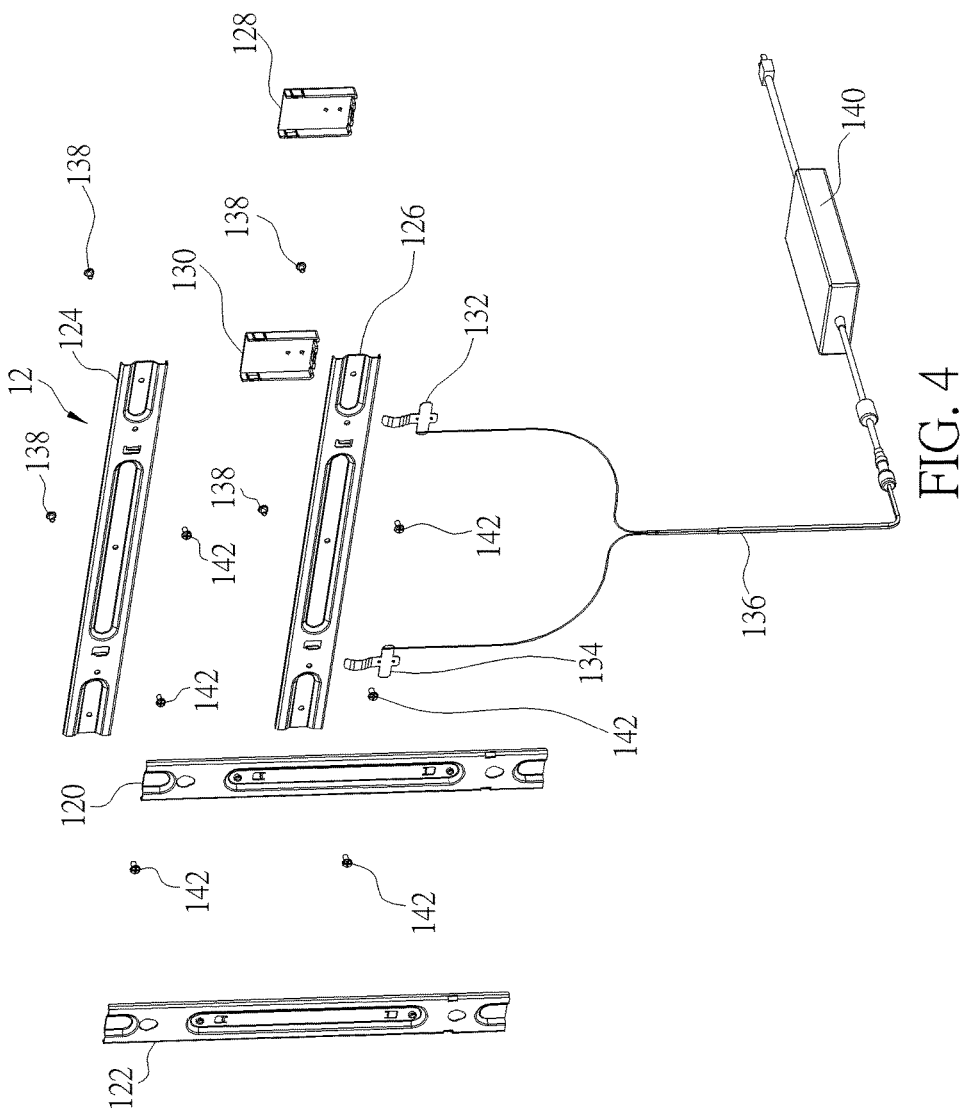
FIG. 4 is an exploded view illustrating the wall mount module shown in FIG. 3.

Referring to FIGS. 1 to 4, FIG. 1 is a perspective front view illustrating a display device 1 hanged on a wall 3 according to an embodiment of the invention, FIG. 2 is a perspective rear view illustrating the device body 10 shown in FIG. 1, FIG. 3 is a perspective view illustrating the device body 10 removed from FIG. 1, and FIG. 4 is an exploded view illustrating the wall mount module 12 shown in FIG. 3.

As shown in FIGS. 1 to 4, the display device 1 comprises a device body 10 and a wall mount module 12. In this embodiment, the device body 10 may be a TV, a monitor, a digital signage display or other displays. It should be noted that the device body 10 of the invention may also be other objects capable of being assembled with the wall mount module 12, so the device body 10 is not limited to a display.

As shown in FIG. 2, a back 100 of the device body 10 has a first conducting pillar 102, a second conducting pillar 104, a third conducting pillar 106 and a fourth conducting pillar 108. In this embodiment, the first conducting pillar 102, the second conducting pillar 104, the third conducting pillar 106 and the fourth conducting pillar 108 may be conducting screws or other conducting members. As shown in FIGS. 3 and 4, the wall mount module 12 comprises a first bracket 120, a second bracket 122, a third bracket 124, a fourth bracket 126, a first cover 128, a second cover 130, a first conducting member 132, a second conducting member 134 and a power cable 136.

Figure 5:
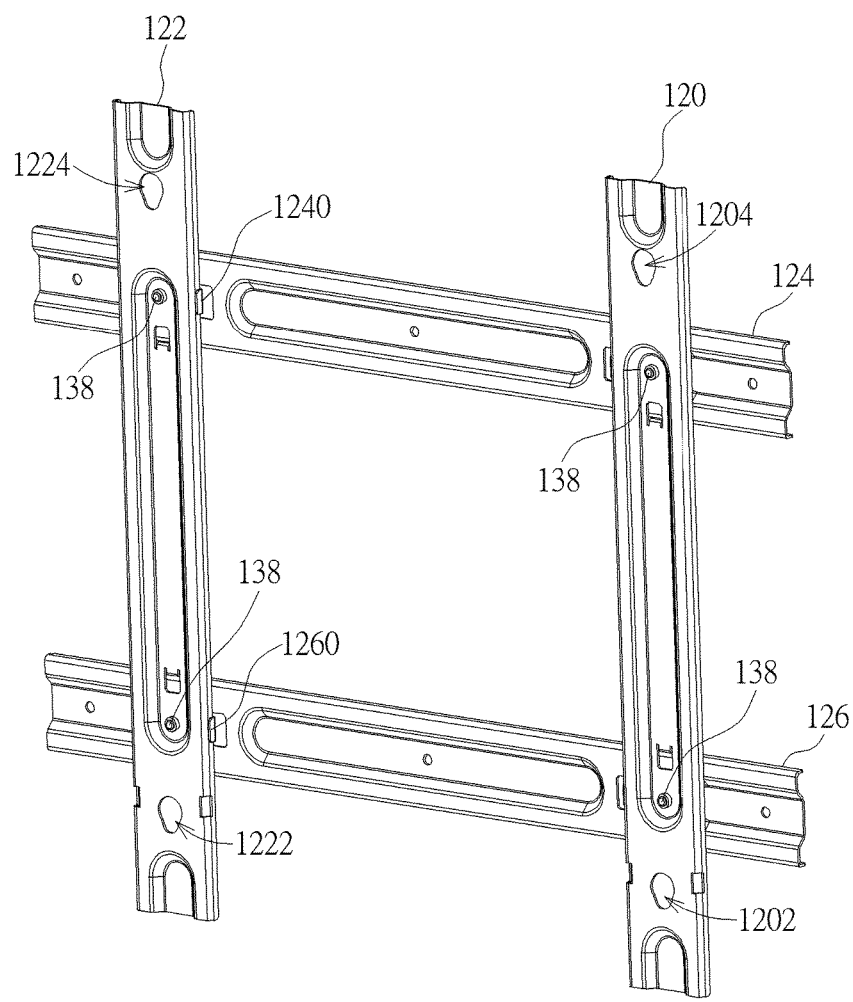
FIG. 5 is a perspective front view illustrating the first bracket, the second bracket, the third bracket and the fourth bracket shown in FIG. 4 after being assembled with each other.
Figure 6:
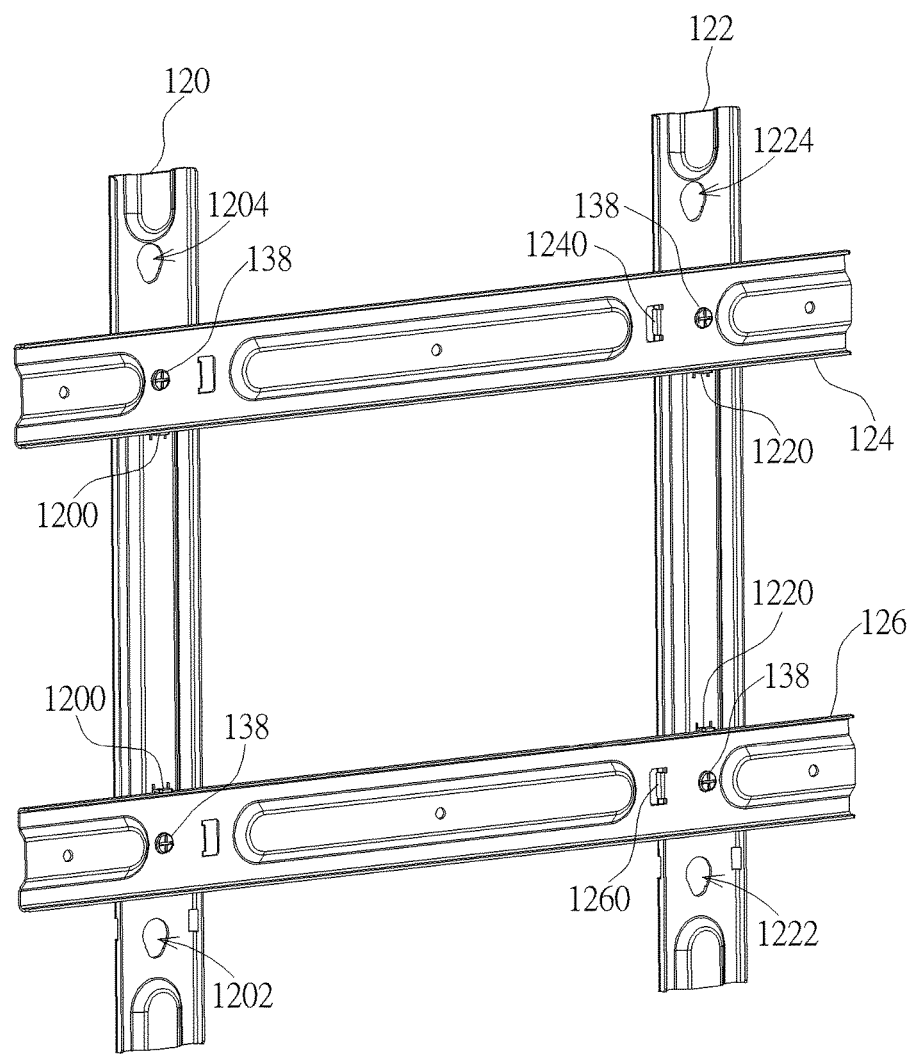
FIG. 6 is a perspective rear view illustrating the first bracket, the second bracket, the third bracket and the fourth bracket shown in FIG. 4 after being assembled with each other.
Figure 7:
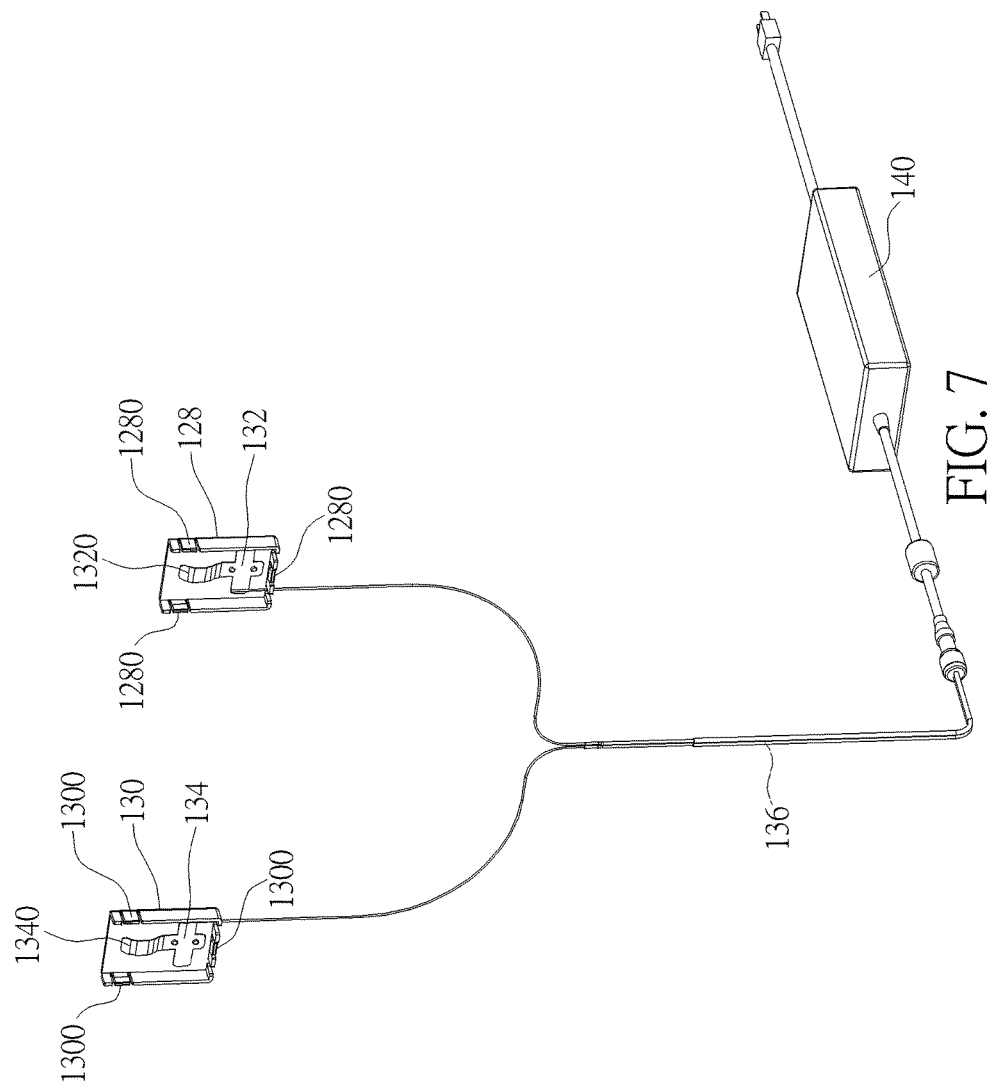
FIG. 7 is a perspective front view illustrating the first conducting member and the second conducting member shown in FIG. 4 being disposed in the first cover and the second cover, respectively.
Figure 8:
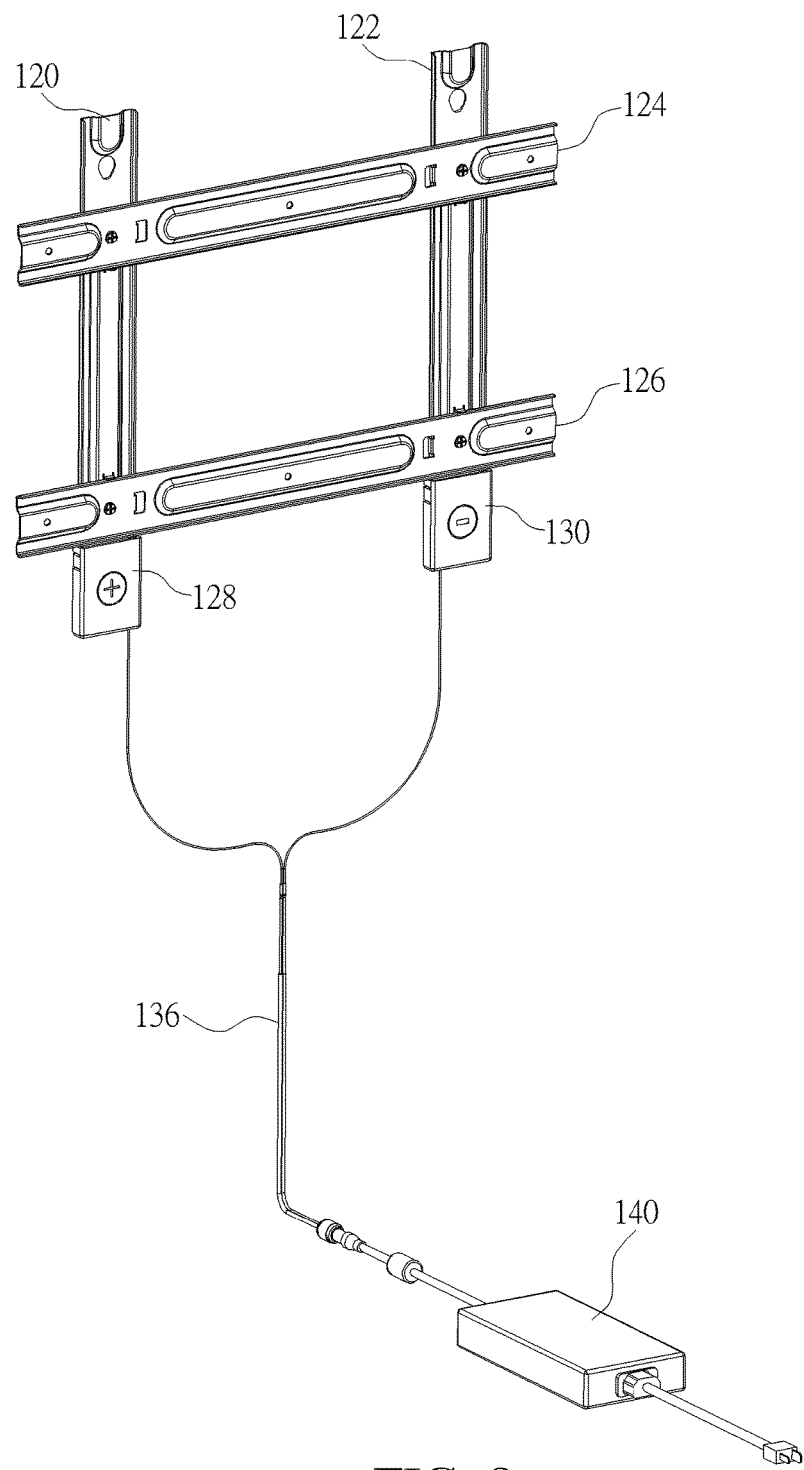
FIG. 8 is a perspective rear view illustrating the first cover and the second cover shown in FIG. 7 being disposed on the first bracket and the second bracket shown in FIG. 6, respectively.
Figure 9:
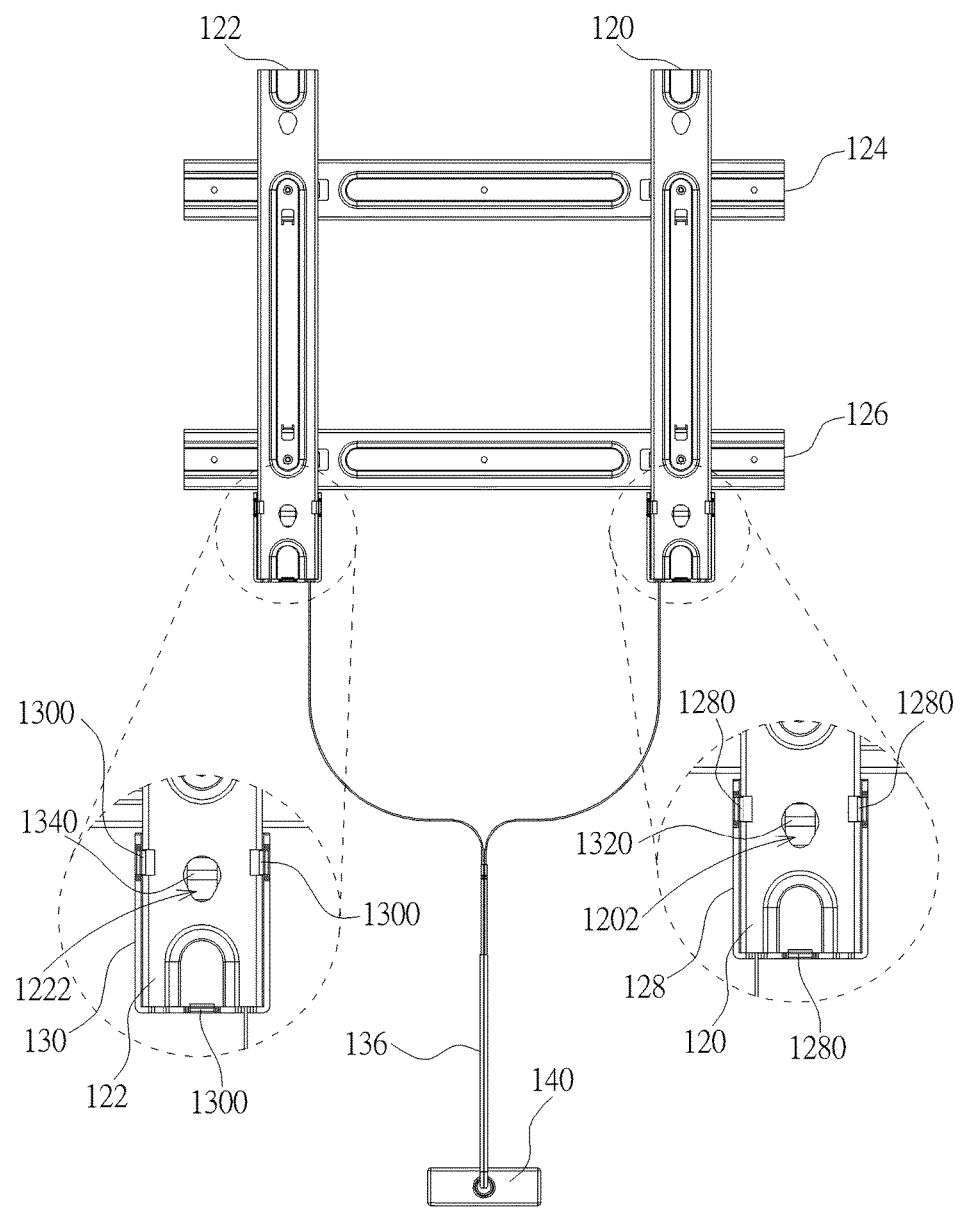
FIG. 9 is a front view illustrating the first cover and the second cover shown in FIG. 7 being disposed on the first bracket and the second bracket shown in FIG. 6, respectively.

Referring to FIGS. 5 to 9, FIG. 5 is a perspective front view illustrating the first bracket 120, the second bracket 122, the third bracket 124 and the fourth bracket 126 shown in FIG. 4 after being assembled with each other, FIG. 6 is a perspective rear view illustrating the first bracket 120, the second bracket 122, the third bracket 124 and the fourth bracket 126 shown in FIG. 4 after being assembled with each other, FIG. 7 is a perspective front view illustrating the first conducting member 132 and the second conducting member 134 shown in FIG. 4 being disposed in the first cover 128 and the second cover 130, respectively, FIG. 8 is a perspective rearview illustrating the first cover 128 and the second cover 130 shown in FIG. 7 being disposed on the first bracket 120 and the second bracket 122 shown in FIG. 6, respectively, and FIG. 9 is a front view illustrating the first cover 128 and the second cover 130 shown in FIG. 7 being disposed on the first bracket 120 and the second bracket 122 shown in FIG. 6, respectively.

To assemble the wall mount module 12 of the invention, first of all, the third bracket 124 may be connected to upper portions of the first bracket 120 and the second bracket 122 and the fourth bracket 126 may be connected to lower portions of the first bracket 120 and the second bracket 122, such that the first bracket 120 is parallel to the second bracket 122 and the third bracket 124 is parallel to the fourth bracket 126, as shown in FIGS. 5 and 6. In this embodiment, the invention may use a plurality of screws 138 or other fixing members to fix the brackets connected to each other, wherein the screws 138 may be non-conducting screws (e.g. plastic screws). Furthermore, the first bracket 120 may have two first positioning portions 1200, the second bracket 122 may have two second positioning portions 1220, the third bracket 124 may have two third positioning portions 1240, and the fourth bracket 126 may have two fourth positioning portions 1260. As shown in FIGS. 5 and 6, the two first positioning portions 1200 may cooperate with the two second positioning portions 1220 to position the third bracket 124 and the fourth bracket 126 with respect to each other, and the two third positioning portions 1240 may cooperate with the two fourth positioning portions 1260 to position the first bracket 120 and the second bracket 122 with respect to each other. Accordingly, the invention may facilitate the assembly of the first bracket 120, the second bracket 122, the third bracket 124 and the fourth bracket 126.

Afterward, an anode end and a cathode end of the power cable 136 may be connected to the first conducting member 132 and the second conducting member 134, respectively, as shown in FIG. 4. In this embodiment, the anode end and the cathode end of the power cable may be fixed on the first conducting member 132 and the second conducting member 134, respectively, by welding. Furthermore, the power cable 136 is connected to an adapter 140, wherein the adapter 140 may convert alternating current (AC) to direct current (DC) and then transmit direct current to the first conducting member 132 and the second conducting member 134 through the anode end and the cathode end of the power cable 136, respectively. In this embodiment, the first conducting member 132 and the second conducting member 134 may be made of conducting metal, wherein the first conducting member 132 may have a first resilient portion 1320 and the second conducting member 134 may have a second resilient portion 1340.

Then, the first conducting member 132 and the second conducting member 134 may be disposed in the first cover 128 and the second cover 130, respectively, as shown in FIG. 7. In this embodiment, the first conducting member 132 and the second conducting member 134 may be fixed in the first cover 128 and the second cover 130, respectively, by welding, engagement or other fixing manners.

Then, the first cover 128 may be disposed on the first bracket 120 and the second cover 130 may be disposed on the second bracket 122, as shown in FIG. 8. At this time, the first conducting member 132 is disposed between the first cover 128 and the first bracket 120, and the second conducting member 134 is disposed between the second cover 130 and the second bracket 122. In this embodiment, the first cover 128 may have a plurality of first engaging portions 1280 and the second cover 130 may have a plurality of second engaging portions 1300. As shown in FIG. 9, the first cover 128 may be engaged with an end of the first bracket 120 by the first engaging portions 1280 and the second cover 130 may be engaged with an end of the second bracket 122 by the second engaging portions 1300. It should be noted that the first cover 128 and the second cover 130 may also be disposed on the first bracket 120 and the second bracket 122, respectively, by other manners (e.g. adhesion, screws, etc.) besides engagement.

In this embodiment, opposite sides of the first bracket 120 have a first hole 1202 and a third hole formed thereon and opposite sides of the second bracket 122 have a second hole 1222 and a fourth hole 1224 formed thereon. As shown in FIG. 9, when the first cover 128 and the second cover 130 are disposed on the first bracket 120 and the second bracket 122, respectively, the first resilient portion 1320 of the first conducting member 132 is exposed through the first hole 1202 of the first bracket 120 and the second resilient portion 1340 of the second conducting member 134 is exposed through the second hole 1222 of the second bracket 122.

When a user wants to hang the display device 1 on the wall 3, the user may use a plurality of screws 142 to fix the third bracket 124 and the fourth bracket 126 of the wall mount module 12 onto the wall 3, as shown in FIG. 3. Then, the user may insert the first conducting pillar 102, the second conducting pillar 104, the third conducting pillar 106 and the fourth conducting pillar 108 of the back 100 of the device body 10 into the first hole 1202, the second hole 1222, the third hole 1204 and the fourth hole 1224 of the first bracket 120 and the second bracket 122, respectively, so as to fix the device body 10 on the first bracket 120 and the second bracket 122. Accordingly, the display device 1 is hanged on the wall 3.

After the first conducting pillar 102 passes through the first hole 1202 of the first bracket 120 and the second conducting pillar 104 passes through the second hole 1222 of the second bracket 122, the first conducting pillar 102 abuts against the first resilient portion 1320 of the first conducting member 132 and the second conducting pillar 104 abuts against the second resilient portion 1340 of the second conducting member 134. At this time, the power cable 136 may supply power to the device body 10 through an electrical contact formed between the first conducting member 132 and the first conducting pillar 102 and an electrical contact formed between the second conducting member 134 and the second conducting pillar 104. It should be noted that the invention may spray insulating paint on the first bracket 120 and the second bracket 122, so as to avoid power leakage through the first bracket 120 and the second bracket 122.

Figure 10:
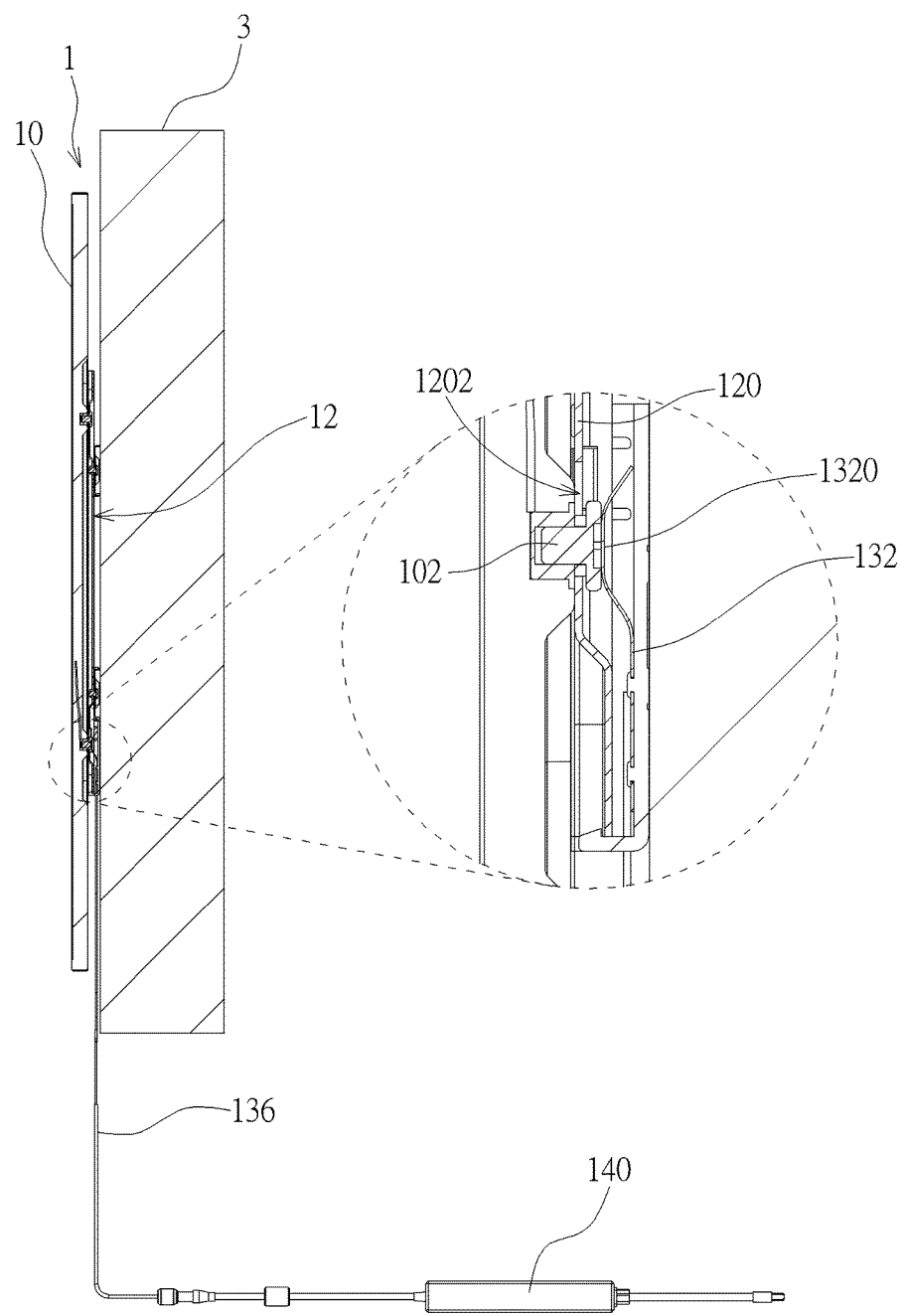
FIG. 10 is a sectional view illustrating the display device shown in FIG. 1 along line X-X.

Referring to FIG. 10, FIG. 10 is a sectional view illustrating the display device 1 shown in FIG. 1 along line X-X. As shown in FIG. 10, after the first conducting pillar 102 passes through the first hole 1202 of the first bracket 120, the first conducting pillar 102 abuts against the first resilient portion 1320 of the first conducting member 132, such that an electrical contact is formed between the first conducting member 132 and the first conducting pillar 102. The first resilient portion 1320 is compressed by the first conducting pillar 102 and deforms elastically, such that the first conducting member 132 contacts the first conducting pillar 102 tightly, so as to ensure electrical conduction. It should be noted that the principle of the second conducting member 134 and the second conducting pillar 104 is the same as the above, so is will not be depicted herein again.

Figure 11:
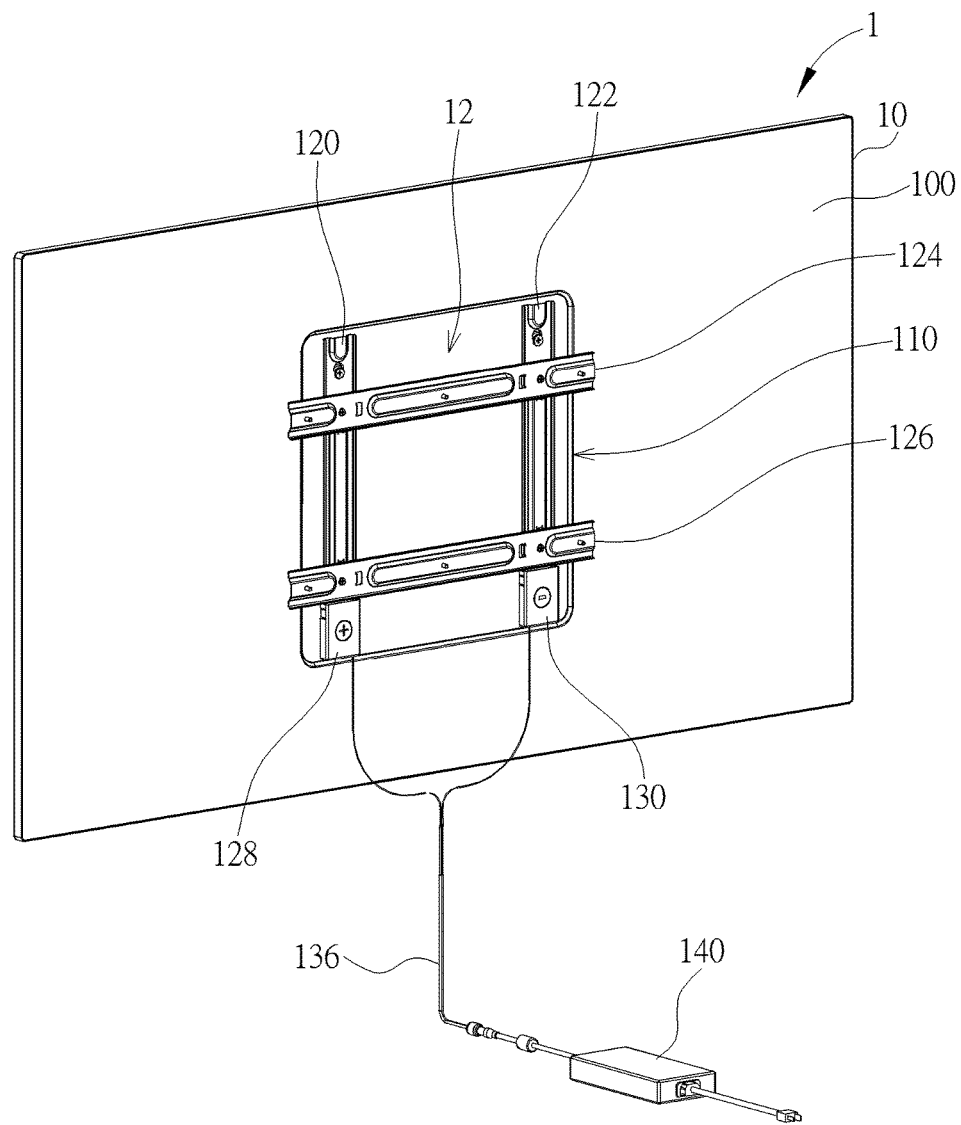
FIG. 11 is a perspective rear view illustrating the device body shown in FIG. 2 assembled with the wall mount module shown in FIG. 3.

Referring to FIG. 11, FIG. 11 is a perspective rear view illustrating the device body 10 shown in FIG. 2 assembled with the wall mount module 12 shown in FIG. 3. As shown in FIG. 11, the back 100 of the device body 10 may further have a recess 110. After assembling the device body 10 with the wall mount module 12, the first bracket 120 and the second bracket 122 of the wall mount module 12 may be accommodated in the recess 110. When the device body 10 is hanged on the wall 3 by the wall mount module 12, the device body 10 may be attached to the wall 3 as close as possible, so as to enhance the visual effect of the display device 1.

As mentioned in the above, the power cable of the invention is connected to the conducting member on the bracket of the wall mount module. Therefore, when the conducting pillar passes through the hole on the bracket correspondingly and then abuts against the conducting member, the power cable may supply power to the device body through an electrical contact formed between the conducting member and the conducting pillar. The user may fix the bracket of the wall mount module on a wall first and then insert the conducting pillar of the back of the device body into the hole on the bracket correspondingly, such that the display device is hanged on the wall. Accordingly, the power cable will not interfere with the assembly of the device body and the wall mount module. Furthermore, since the invention hides the conducting member in the cover, the total thickness of the wall mount module will not increase, such that the invention is capable of being thinned favorably. Moreover, when the display device is hanged on the wall, the invention may dispose the bracket of the wall mount module in the recess of the back of the device body, so as to attach the display device to the wall as close as possible. Accordingly, the invention may enhance the visual effect of the display device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display device comprising:
   a device body, a back of the device body having a first conducting pillar and a second conducting pillar; and
   a wall mount module comprising a first bracket, a second bracket, a first cover, a second cover, a first conducting member, a second conducting member and a power cable, the first cover being disposed on the first bracket, the second cover being disposed on the second bracket, the first conducting member being disposed between the first cover and the first bracket, the second conducting member being disposed between the second cover and the second bracket, the power cable being connected to the first conducting member and the second conducting member, the first bracket having a first hole formed thereon, the first conducting member being exposed through the first hole, the second bracket having a second hole formed thereon, the second conducting member being exposed through the second hole;
   wherein the first conducting pillar passes through the first hole and the second conducting pillar passes through the second hole, such that the device body is fixed on the first bracket and the second bracket, the first conducting pillar abuts against the first conducting member, and the second conducting pillar abuts against the second conducting member.

2. The display device of claim 1, wherein the wall mount module further comprises a third bracket and a fourth bracket, the third bracket is connected to the first bracket and the second bracket, the fourth bracket is connected to the first bracket and the second bracket, the first bracket is parallel to the second bracket, and the third bracket is parallel to the fourth bracket.

3. The display device of claim 2, wherein the first bracket further has two first positioning portions, the second bracket further has two second positioning portions, the third bracket has two third positioning portions, the fourth bracket has two fourth positioning portions, the two first positioning portions cooperates with the two second positioning portions to position the third bracket and the fourth bracket, and the two third positioning portions cooperates with the two fourth positioning portions to position the first bracket and the second bracket.

4. The display device of claim 1, wherein the back of the device body further has a third conducting pillar and a fourth conducting pillar, the first bracket further has a third hole formed thereon, the second bracket further a fourth hole formed thereon, the third conducting pillar passes through the third hole, and the fourth conducting pillar passes through the fourth hole, such that the device body is fixed on the first bracket and the second bracket.

5. The display device of claim 1, wherein the first conducting member has a first resilient portion, the first resilient portion is exposed through the first hole, the second conducting member has a second resilient portion, the second resilient portion is exposed through the second hole, the first conducting pillar abuts against the first resilient portion, and the second conducting pillar abuts against the second resilient portion.

6. The display device of claim 1, wherein the first cover has a plurality of first engaging portions, the first cover is engaged with an end of the first bracket by the first engaging portions, the second cover has a plurality of second engaging portions, and the second cover is engaged with an end of the second bracket by the second engaging portions.

7. The display device of claim 1, wherein the back of the device body further has a recess, and the first bracket and the second bracket are accommodated in the recess.

8. A wall mount module comprising:
  a first bracket having a first hole formed thereon;
  a second bracket having a second hole formed thereon;
  a first cover disposed on the first bracket;
  a second cover disposed on the second bracket;
  a first conducting member disposed between the first cover and the first bracket, the first conducting member being exposed through the first hole;
  a second conducting member disposed between the second cover and the second bracket, the second conducting member being exposed through the second hole; and
  a power cable connected to the first conducting member and the second conducting member.

9. The wall mount module of claim 8, further comprising a third bracket and a fourth bracket, the third bracket being connected to the first bracket and the second bracket, the fourth bracket being connected to the first bracket and the second bracket, the first bracket being parallel to the second bracket, and the third bracket being parallel to the fourth bracket.

10. The wall mount module claim 9, wherein the first bracket further has two first positioning portions, the second bracket further has two second positioning portions, the third bracket has two third positioning portions, the fourth bracket has two fourth positioning portions, the two first positioning portions cooperates with the two second positioning portions to position the third bracket and the fourth bracket, and the two third positioning portions cooperates with the two fourth positioning portions to position the first bracket and the second bracket.

11. The wall mount module of claim 8, wherein the first conducting member has a first resilient portion, the first resilient portion is exposed through the first hole, the second conducting member has a second resilient portion, and the second resilient portion is exposed through the second hole.

12. The wall mount module of claim 8, wherein the first cover has a plurality of first engaging portions, the first cover is engaged with an end of the first bracket by the first engaging portions, the second cover has a plurality of second engaging portions, and the second cover is engaged with an end of the second bracket by the second engaging portions.

* * * * *